United States Patent
Hiratsuka

(10) Patent No.: US 8,409,889 B2
(45) Date of Patent: *Apr. 2, 2013

(54) METHOD FOR PRODUCING SEMICONDUCTOR OPTICAL DEVICE

(75) Inventor: Kenji Hiratsuka, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 371 days.

This patent is subject to a terminal disclaimer.

(21) Appl. No.: 12/782,182

(22) Filed: May 18, 2010

(65) Prior Publication Data
US 2010/0297789 A1    Nov. 25, 2010

(30) Foreign Application Priority Data
May 22, 2009    (JP) ................................. 2009-124451

(51) Int. Cl.
*H01L 21/00* (2006.01)
(52) U.S. Cl. ........ 438/32; 438/16; 438/26; 257/E21.529
(58) Field of Classification Search ........... 257/E21.529; 438/16, 26, 32
See application file for complete search history.

(56) References Cited

U.S. PATENT DOCUMENTS

| | | | |
|---|---|---|---|
| 7,112,813 B2* | 9/2006 | Den Boef et al. ........... | 250/559.3 |
| 7,193,713 B2* | 3/2007 | Shiode ........................ | 356/399 |
| 7,452,734 B2* | 11/2008 | Kang ........................... | 438/16 |
| 8,139,217 B2* | 3/2012 | Van Bilsen et al. .......... | 356/399 |
| 8,216,866 B2* | 7/2012 | Uesaka et al. ................ | 438/32 |
| 8,222,058 B2* | 7/2012 | Ishihara ....................... | 438/26 |
| 2003/0160163 A1* | 8/2003 | Wong et al. ................. | 250/237 R |

FOREIGN PATENT DOCUMENTS

| | | |
|---|---|---|
| JP | 6-21570 | 1/1994 |
| JP | 8-227838 | 9/1996 |
| JP | 2000-323461 | 11/2000 |

* cited by examiner

*Primary Examiner* — John C Ingham
(74) *Attorney, Agent, or Firm* — Smith, Gambrell & Russell, LLP

(57) ABSTRACT

A method for producing a semiconductor optical device, includes the steps of: (a) forming a semiconductor region on a substrate, the substrate including first and second areas; the first area including device sections (b) forming a first mask on the semiconductor region, the first mask including first patterns periodically arranged in the first area and a second pattern provided in the second area; (c) forming a plurality of periodic structures in each of the device sections and a monitoring structure in the second area by using the first mask, the periodic structures respectively corresponding to the first patterns, the monitoring structure corresponding to the second pattern; (d) measuring a shape of the monitoring structure; (e) selecting a desired periodic structure from the plurality of periodic structures on a basis of a result of measuring the shape of the monitoring structure; (f) forming a second mask including a pattern on the desired periodic structure; and (g) forming stripe mesas including the desired periodic structure by using the second mask.

14 Claims, 11 Drawing Sheets

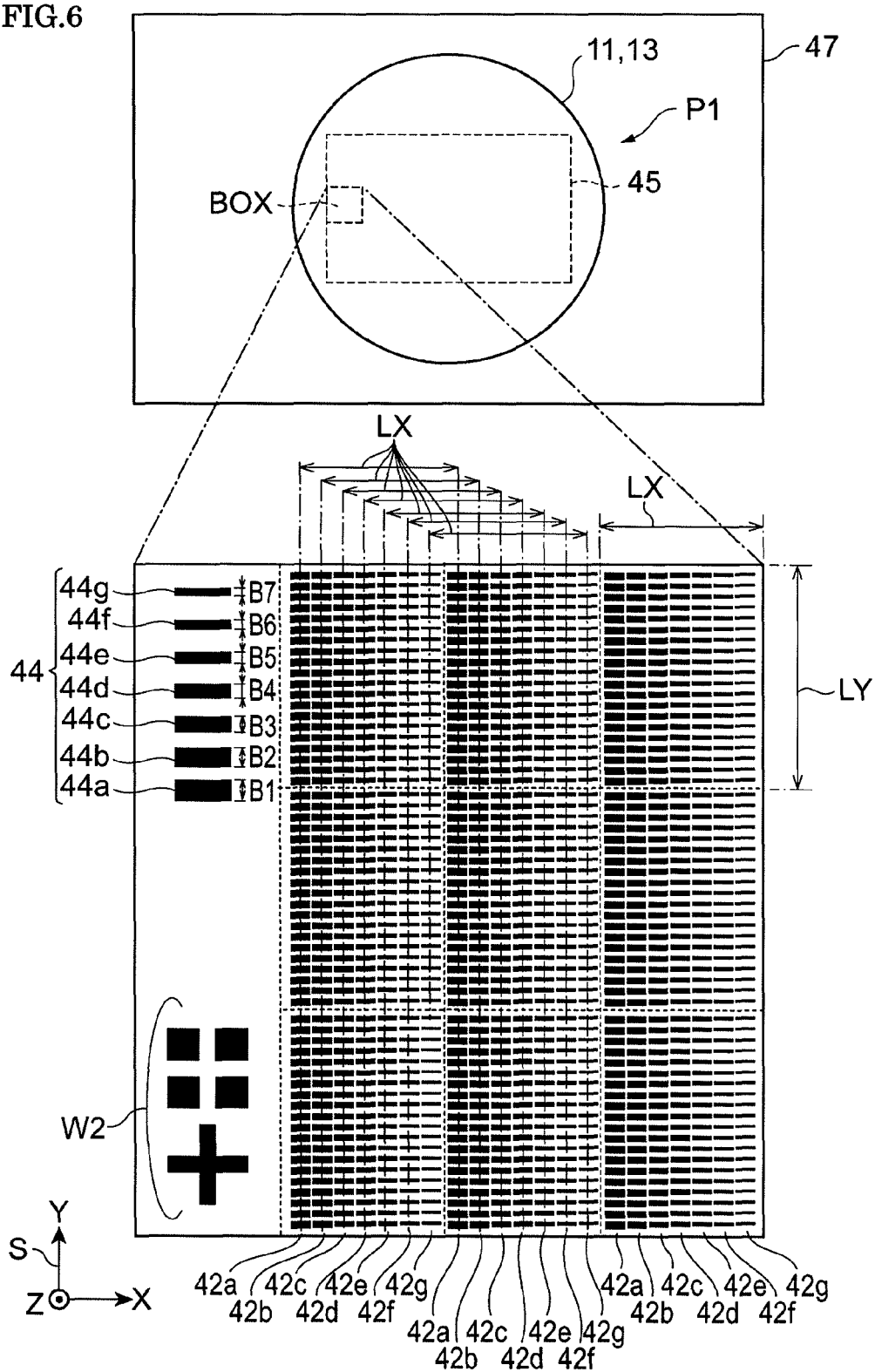

FIG.10
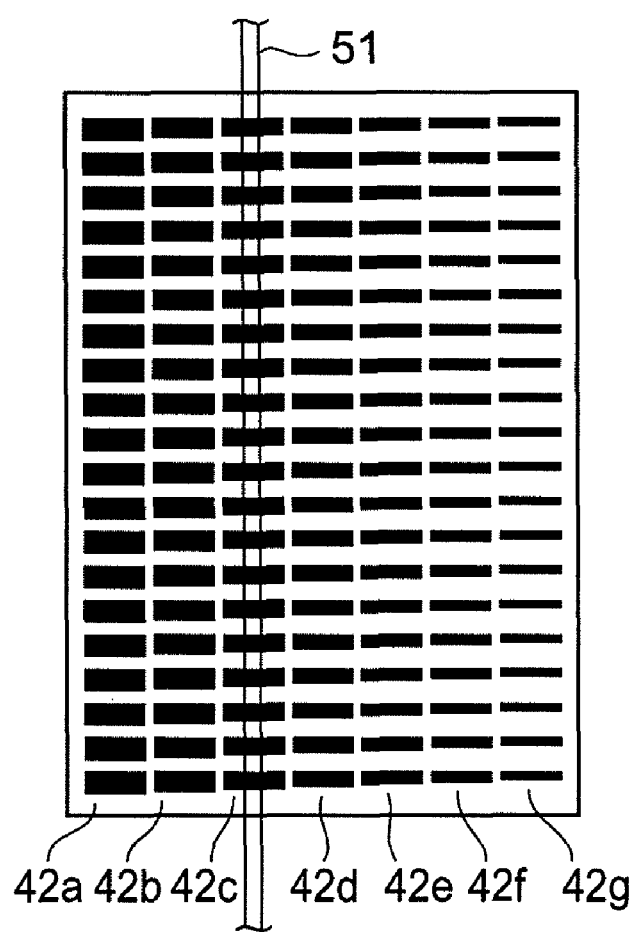
42a 42b 42c  42d  42e  42f  42g
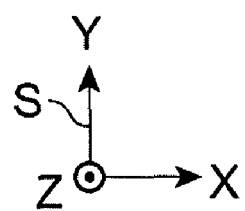

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Description of the Related Art

Patent Document 1 (Japanese Unexamined Patent Application Publication No. 6-21570) describes a method for producing a semiconductor optical device. According to this method, a first phosphorus-containing compound semiconductor layer and a second phosphorus-containing compound semiconductor layer are sequentially formed on a compound semiconductor layer serving as a base. The second phosphorus-containing compound semiconductor layer is composed of a material different from the material of the first phosphorus-containing compound semiconductor layer. A diffraction grating is subsequently formed in the first phosphorus-containing compound semiconductor layer and the second phosphorus-containing compound semiconductor layer is left on the projections of the diffraction grating. A heat treatment is then performed to make the second phosphorus-containing compound semiconductor layer on the projections of the diffraction grating fill the recesses of the diffraction grating.

Patent Document 2 (Japanese Unexamined Patent Application Publication No. 8-227838) describes a method for forming a fine pattern. According to this method, a diffraction grating is formed by an electron beam exposure method. In this method, a pitch of the diffraction grating is not restricted by the minimum travel length of an electron beam of an exposure system. As a result, the lasing wavelength of a distributed feedback (DFB) laser can be readily controlled.

Patent Document 3 (Japanese Unexamined Patent Application Publication No. 2000-323461) describes a method for forming a fine pattern by a nano-imprint method. A mold for the nano-imprint method is placed on a mold substrate which is made of a transparent material and alignment marks are formed on the mold substrate. Alignment marks corresponding to the alignment marks formed on the mold substrate are also formed on a wafer. To accurately align the mold with the mold substrate, after the alignment marks are formed on the mold substrate, the mold for the nano-imprint method is formed with reference to the positions of the alignment marks of the mold substrate. By forming the mold and the alignment marks on the mold substrate, the alignment marks on the mold substrate and the alignment marks on the wafer can be simultaneously referred to when viewed from above the wafer through the mold substrate. By referring to these alignment marks in this way, the wafer and the mold are aligned relative to each other.

SUMMARY OF THE INVENTION

In the production of semiconductor optical devices having diffraction gratings, for example, distributed feedback (DFB) lasers, a semiconductor is etched to form projections and recesses that are periodically arranged to form diffraction gratings as described in Patent Document 1. In etching the semiconductor to form diffraction gratings, variation in the etching amount causes variation in the depth of the resultant projections and recesses that are periodically arranged. This variation in the depth of the projections and recesses causes variation in the coupling coefficient of the diffraction grating of a DFB laser.

Semiconductor lasers used for optical communications are required to have a predetermined lasing wavelength. For this reason, DFB lasers are made to have a predetermined lasing wavelength by adjusting the period of a diffraction grating, which determines the lasing wavelength.

In a semiconductor process for forming a diffraction grating, a resist mask is formed by forming the pattern of the diffraction grating in a resist on a semiconductor layer. A semiconductor layer is etched through this resist mask to thereby transfer the pattern of the diffraction grating to the semiconductor layer. Thus, a plurality of periodic projections and recesses for the diffraction grating are formed in the semiconductor layer.

Many DFB lasers include diffraction gratings having a uniform period. Patterning for forming such diffraction gratings is conducted by, for example, a two-beam interference exposure technique. When diffraction gratings having a complex pattern such as a phase-shift structure or chirped gratings in which the period of a diffraction grating is modulated are formed, an electron beam exposure method is employed. The formation of such diffraction gratings having a complex pattern can be conducted by a nano-imprint method as well as the electron beam exposure method. The nano-imprint method is performed as follows. A mold in which the pattern structure of a diffraction grating is formed is prepared. The patterned surface of the mold is pressed into a resin coated on a semiconductor layer to thereby transfer the pattern formed in the mold to the resin. The semiconductor layer is etched through the resultant patterned resin serving as a mask to thereby form the pattern of the diffraction grating on the semiconductor layer.

The period of a diffraction grating defines the laser wavelength. The depth of projections and recesses of a diffraction grating is related to the coupling coefficient, which defines the degree of interaction between laser light propagating in an active layer of the optical device and the diffraction grating. The product ($\kappa \times L$) of the coupling coefficient ($\kappa$) of a diffraction grating and cavity length (L) influences characteristics of DFB lasers. Other than the depth of projections and recesses of a diffraction grating, the coupling coefficient is also related to the difference in refractive index between materials forming the diffraction grating, the duty ratio of the diffraction grating, and the like.

By employing the interference exposure technique, a mask having a uniform and large-area pattern for forming diffraction gratings can be formed. A semiconductor layer is etched through this mask to pattern the semiconductor layer. Additionally, a diffraction efficiency measurement device attached to an interference exposure system can also be used to evaluate the depth of projections and recesses and the diffraction efficiency of the diffraction gratings in the etched semiconductor layer.

However, when diffraction gratings are formed by an electron beam exposure method or a nano-imprint method, such evaluation of characteristics of diffraction gratings in the production process is difficult. This is because the size of a region being patterned at any one time is small and patterns of a plurality of types are formed together.

An aspect of the present invention is a method for producing a semiconductor optical device. This method includes steps of (a) forming a semiconductor region including a semiconductor layer on a substrate, the substrate including first and second areas, the first area including device sections; (b) forming a first mask on the semiconductor region, the first mask including first patterns periodically arranged in the first area and a second pattern provided in the second area; (c) forming a plurality of periodic structures in each of the device sections in the semiconductor region in the first area and a monitoring structure in the semiconductor region in the second area by using the first mask, the periodic structures respectively corresponding to the first patterns, the monitoring structure corresponding to the second pattern; (d) measuring a shape of the monitoring structure; (e) selecting a desired periodic structure from the plurality of periodic structures on a basis of a result of measuring the shape of the monitoring structure; (f) forming a second mask including a pattern on the desired periodic structure; and (g) forming stripe mesas including the desired periodic structure by using the second mask. The plurality of periodic structures may each extend in a predetermined direction; and the plurality of periodic structures may have an identical period but may have different duty ratios from one another. The plurality of periodic structures may include projections and recesses periodically arranged so as to form diffraction gratings.

According to the above-described method, the shape of the monitoring structure formed in the semiconductor region is measured and a desired periodic structure is selected from the plurality of periodic structures on the basis of the result of the measurement. By measuring the shape of the monitoring structure, data in terms of the influence of the variation in a semiconductor process (for example, variation of etching rate in the etching process) can be obtained. By using the result of measuring the shape of the monitoring structure, a periodic structure having a duty ratio that gives a desired coupling coefficient to a diffraction grating can be selected.

In the above-described method according to the present invention, it is preferred that the second mask may include openings formed on periodic structures other than the desired periodic structure; and the periodic structures other than the desired periodic structure may be removed upon formation of the stripe mesas.

According to this method, the stripe mesas include the desired periodic structure. Additionally, since the periodic structures other than the desired periodic structure are removed, interference between the periodic structures can be avoided. Semiconductor devices including the desired periodic structure can be obtained without changing the configuration of the devices.

The above-described method according to the present invention may further include a step of, after the stripe mesas are formed, growing a buried layer for burying the stripe mesas.

In the above-described method according to the present invention, the monitoring structure may include a plurality of grooves having different widths from one another. According to this method, the shapes of the grooves of the monitoring structure reflect the micro-loading effect in the periodic structures for diffraction gratings and the difference in the depth of grooves caused by variation in the semiconductor process (for example, variation of etching rate in the etching process). The measured values of the depth of the grooves of the monitoring structure can provide data that indicates which periodic structure among the plurality of periodic structures can achieve a desired coupling coefficient.

In the above-described method according to the present invention, the plurality of periodic structures each may extend in a predetermined direction; the plurality of grooves may be arranged adjacent to one another in the predetermined direction; distances between adjacent grooves among the plurality of grooves arranged may be different from one another; and the plurality of grooves may each extend in a direction intersecting with the predetermined direction.

According to this method, the plurality of periodic structures each may extend in a predetermined direction. The grooves of the monitoring structure are arranged adjacent to one another in the predetermined direction so as to be arranged in the direction in which the periodic structures each extend. Additionally, the grooves of the monitoring structure are each made to extend in a direction intersecting with the predetermined direction so as to be oriented in the same direction as in the internal patterns of the periodic structures. As a result, by monitoring the depth of the grooves of the monitoring structure, influence of the micro-loading effect and the difference in the depth of grooves caused by variation in the semiconductor process (for example, variation of etching rate in the etching process) can be enhanced can be corrected with good accuracy.

In the above-described method according to the present invention, the step of measuring the shape of the monitoring structure, for example, grooves, is preferably performed with an atomic force microscope.

The above-described method according to the present invention may further include a step of forming a first alignment mark in the semiconductor region in the second area. In the step of forming the first mask, the first mask may be formed by an electron beam exposure method or a nano-imprint method. At this time, exposure in the electron beam exposure method or alignment of a mold in the nano-imprint method may be performed with reference to the first alignment mark; and the pattern of the second mask may be aligned with reference to the first alignment mark.

According to this method, in the step of forming the first mask, exposure in the electron beam exposure method or alignment of a mold in the nano-imprint method is performed with reference to the alignment mark having been formed in advance in the semiconductor region in the second area and the second mask is also aligned with reference to the same alignment mark. Thus, stripe mesas including desired diffraction gratings can be accurately formed. Additionally, the relative configuration of the first patterns and the second pattern can be always maintained during the step of forming these patterns in the first mask.

The above-described method according to the present invention may be performed as follows. The first mask is formed by a nano-imprint method; the first mask includes a pattern for forming a second alignment mark; and the pattern of the second mask is aligned with reference to the second alignment mark.

According to this method, since the first mask includes a pattern for forming the alignment mark, stripe mesas including desired diffraction gratings can be formed with the resultant second alignment mark. Additionally, the relative configuration of the first and second patterns can be ensured with the accuracy of the patterns formed in the mold for forming the first mask.

The above-described method according to the present invention may further include a step of removing the first mask after the step of forming a plurality of periodic structures and forming a monitoring structure by using the first mask. The step of measuring the shape of the monitoring structure, for example, grooves, is preferably performed after the step of removing the first mask. According to this method, the shape of the monitoring structure can be measured irrespective of the thickness of the first mask. Alternatively, in the above-described method according to the present invention, the step of measuring the shape of the monitoring structure, for example, grooves, is preferably performed before the step of removing the first mask. According to this method, a periodic structure having a desired coupling coefficient can be selected by correcting the measured values of the shape of the monitoring structure by using a value relating to the thickness of the first mask in consideration of the influence of the micro-loading effect caused by etching.

In the above-described method according to the present invention, the semiconductor region may include a first optical waveguide layer, an active layer, a second optical waveguide layer, and a diffraction grating layer. The stripe mesas may include the first optical waveguide layer, the active layer, the second optical waveguide layer, and the diffraction grating layer; and the periodic structures may include projections and recesses periodically arranged so as to form diffraction gratings and the periodic structures may be formed in the diffraction grating layer.

An object, another object, features, and advantages of the present invention will be more readily understood with the following detailed description of preferred embodiments according to the present invention with reference to the attached drawings.

BRIEF DESCRIPTION OF THE DRAWINGS

FIG. 6 illustrates the arrangement of diffraction gratings and a monitoring structure according to the embodiment;

FIG. 10 illustrates a selected periodic structure; and

DESCRIPTION OF THE PREFERRED EMBODIMENTS

Figure 1A:
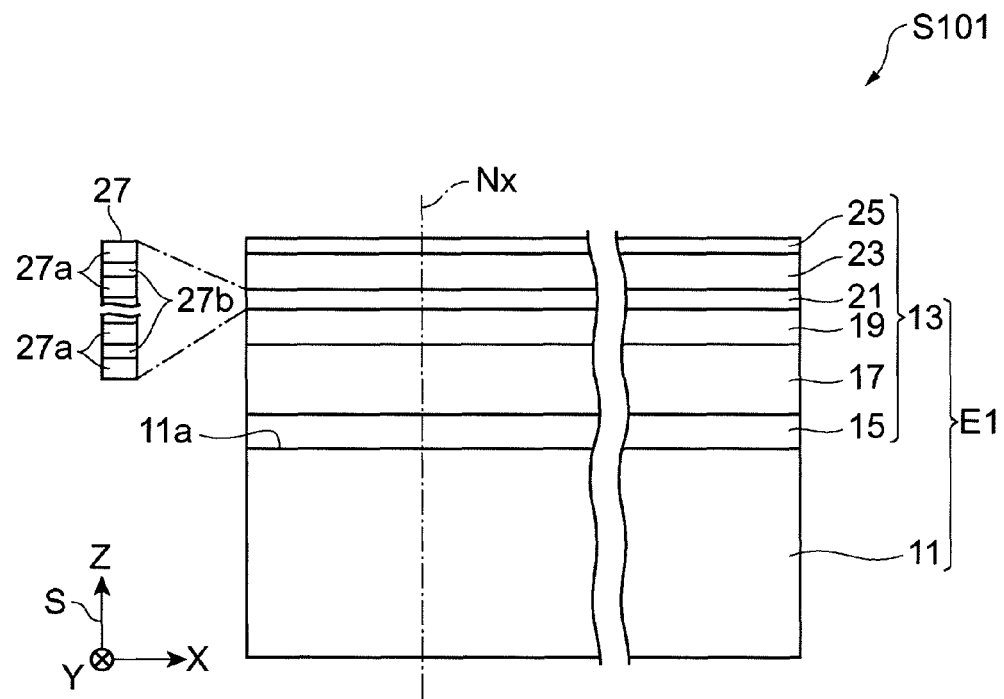
FIGS. 1A and 1B respectively illustrate an epitaxial growth step and a step of forming an alignment mark in a method for producing a semiconductor optical device according to an embodiment of the present invention.

The findings of the present invention can be readily understood in consideration of the following detailed description with reference to the attached drawings illustrated as examples. Hereinafter, a method for producing a semiconductor optical device according to an embodiment of the present invention will be described with reference to the attached drawings. When possible, like elements are denoted with like reference numerals.

Figure 1B:
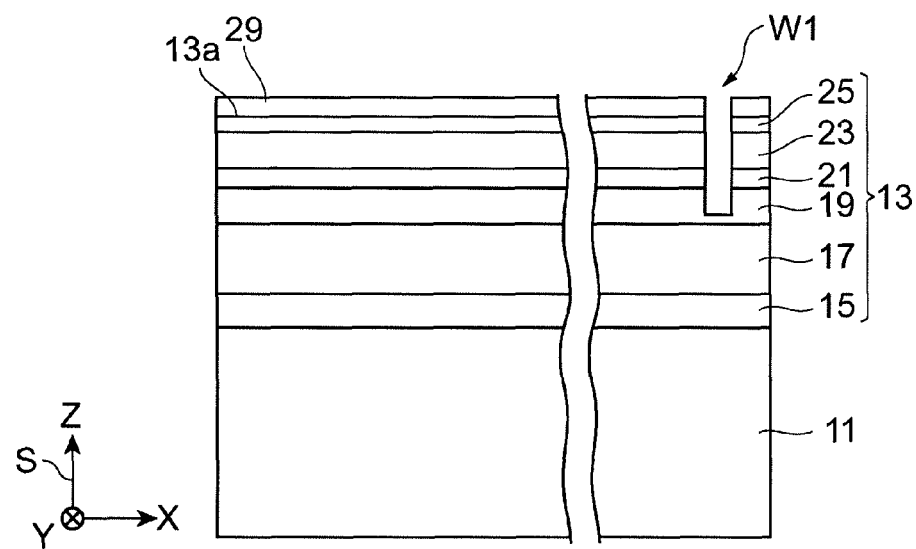

FIGS. 1A and 1B illustrate major steps in a method for producing a semiconductor optical device according to the embodiment. In the following description, a method for producing a distributed feedback (DFB) laser as a semiconductor optical device will be described. However, the embodiment is not restricted to the case where a DFB laser is produced and is also applicable to the production of a semiconductor optical device including a diffraction grating. These diffraction gratings are formed by, for example, an electron beam exposure method or a nano-imprint method. In the method for producing the semiconductor laser, semiconductor layers are grown by, for example, a metal-organic vapor phase epitaxy (MOVPE) method.

In a step of preparing a substrate, a substrate 11 is prepared. The substrate 11 is a semiconductor substrate composed of InP, GaAs, GaN, or the like. The substrate 11 may be an insulator substrate composed of sapphire ($Al_2O_3$) or the like. Referring to FIG. 1A, in step S101, a semiconductor region 13 is formed on the substrate 11. The semiconductor region 13 includes a plurality of III-V group compound semiconductor layers 15, 17, 19, 21, 23, and 25. These semiconductor layers 15, 17, 19, 21, 23, and 25 are formed by, for example, a MOVPE method. The semiconductor layers 15, 17, 19, 21, 23, and 25 are stacked on the principal surface 11a of the substrate 11 in the direction along a normal axis Nx, which is normal to the principal surface 11a. Referring to FIG. 1A, a rectangular coordinate system S is illustrated. The Z axis is along the normal axis Nx and the principal surface 11a is, for example, parallel to a plane defined by the X axis and the Y axis. For example, a 2-inch Sn-doped InP substrate can be used as the semiconductor substrate. In this case, the III-V group compound semiconductor layer 15 formed on this semiconductor substrate is an n-type buffer layer (for example, n-type InP, thickness: 300 nm). The III-V group compound semiconductor layer 17 is an n-type cladding layer (for example, n-type InP, thickness: 550 nm). The III-V group compound semiconductor layer 19 is a first optical waveguide layer (for example, undoped GaInAsP, thickness: 50 nm). The III-V group compound semiconductor layer 21 is an active layer. The III-V group compound semiconductor layer 23 is a second optical waveguide layer (for example, undoped GaInAsP, thickness: 20 nm). The III-V group compound semiconductor layer 25 is a diffraction grating layer (for example, p-type GaInAsP, thickness: 45 nm). In step S101, an epitaxial substrate E1 is formed. The active layer can be constituted by a single semiconductor layer, but preferably has a quantum well structure 27. The quantum well structure 27 includes a stack in which a barrier layer 27a and a well layer 27b are alternately arranged. The barrier layer 27a is composed of, for example, GaInAsP having a bandgap wavelength of 1200 nm and has a thickness of, for example, 10 nm. The well layer 27b is composed of, for example, GaInAsP having a bandgap wavelength of 1550 nm and has a thickness of, for example, 5 nm.

As illustrated in FIG. 1B, in step S102, an alignment mark W1 is formed in the epitaxial substrate E1. This alignment mark W1 is, for example, a recess formed in the epitaxial substrate E1. The alignment mark W1 is formed in, for example, the following manner. An insulator film (for example, thickness: 0.3 µm) composed of, for example, SiN or $SiO_2$ is formed on the epitaxial substrate E1 by chemical vapor deposition (CVD). A resist mask with which the pattern of an alignment mark is to be transferred to the insulator film is formed by photolithography and an etching method. The insulator film is etched by using this resist mask as an etching mask to thereby form a mask 29. In etching the insulator film, a reactive ion etching method is used. This mask 29 has an opening for forming the alignment mark and a principal surface 13a of the semiconductor region 13 is exposed through the opening. When a SiN film is used as the insulator film, $CF_4$ gas is used as an etching gas for etching the SiN film. To remove the resist, an $O_2$ ashing method is used. The semiconductor region 13 is then etched by a reactive ion etching method through the mask 29 to thereby form the alignment mark in the semiconductor region 13. For example, a $CH_4/H_2$ gas mixture is used as an etching gas for etching the semiconductor region 13. A recess serving as the alignment mark W1 has a depth of, for example, 0.5 μm. After the etching of the semiconductor region 13, the mask 29 is removed with, for example, hydrofluoric acid.

Figure 2A:
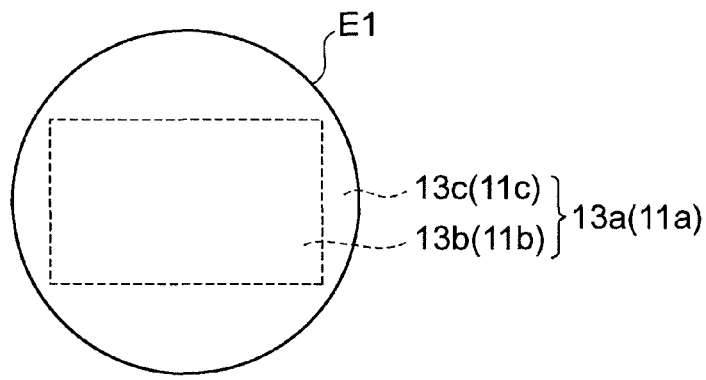
FIGS. 2A and 2B respectively illustrate an epitaxial substrate and patterns for diffraction gratings formed on the epitaxial substrate.
Figure 2B:
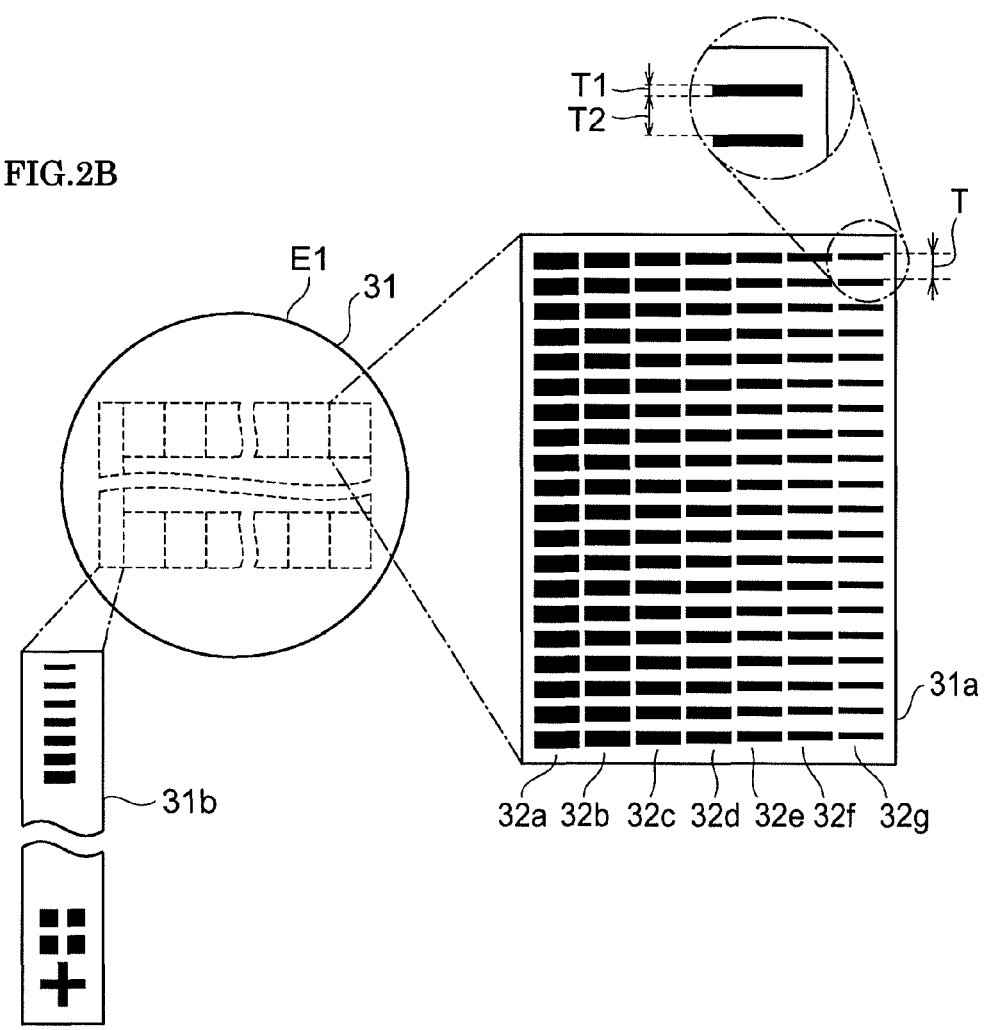

In step S103, a mask 31 for forming diffraction gratings is formed. As illustrated in FIG. 2A, in the epitaxial substrate E1, the semiconductor region 13 includes a first region 13b and a second region 13c. The first region 13b of the semiconductor region 13 is in a first area 11b on the principal surface 11a of the substrate 11. The second region 13c of the semiconductor region 13 is in a second area 11c on the principal surface 11a of the substrate 11. For example, arrays of optical devices are formed in the first area 11b of the substrate 11. Device sections corresponding to the array are defined in the first area 11b. The device sections are arranged in rows and columns. An accessory (for example, an alignment mark) having a predetermined pattern different from such optical devices is formed in the second area 11c of the substrate 11. In step S102, the alignment mark W1 is formed in, for example, the second region 13c of the semiconductor region 13. Arrays of optical devices are formed in the first region 13b of the semiconductor region 13. As illustrated in FIG. 2B, the mask 31 is formed on the principal surface 13a of the semiconductor region 13. The mask 31 has a first pattern 31a and a second pattern 31b. Referring to FIG. 2B, a pattern 31a for forming diffraction gratings in a single device section is illustrated. A single device section is provided for forming a single optical device. Arrays of the first patterns 31a are formed in the first region 13b of the semiconductor region 13. The second pattern 31b is formed in the second region 13c of the semiconductor region 13. Each first pattern 31a includes a plurality of pattern portions 32a, 32b, 32c, 32d, 32e, 32f, and 32g for forming diffraction gratings in a single device section. The pattern portions 32a to 32g extend in an identical direction. The pattern portions 32a to 32g have the same period (T) and different duty ratios of the diffraction grating. The duty ratio of the diffraction grating is defined as the ratio of the width (T1) of projections to the period (T=T1+T2) of the diffraction grating.

Figure 3A:
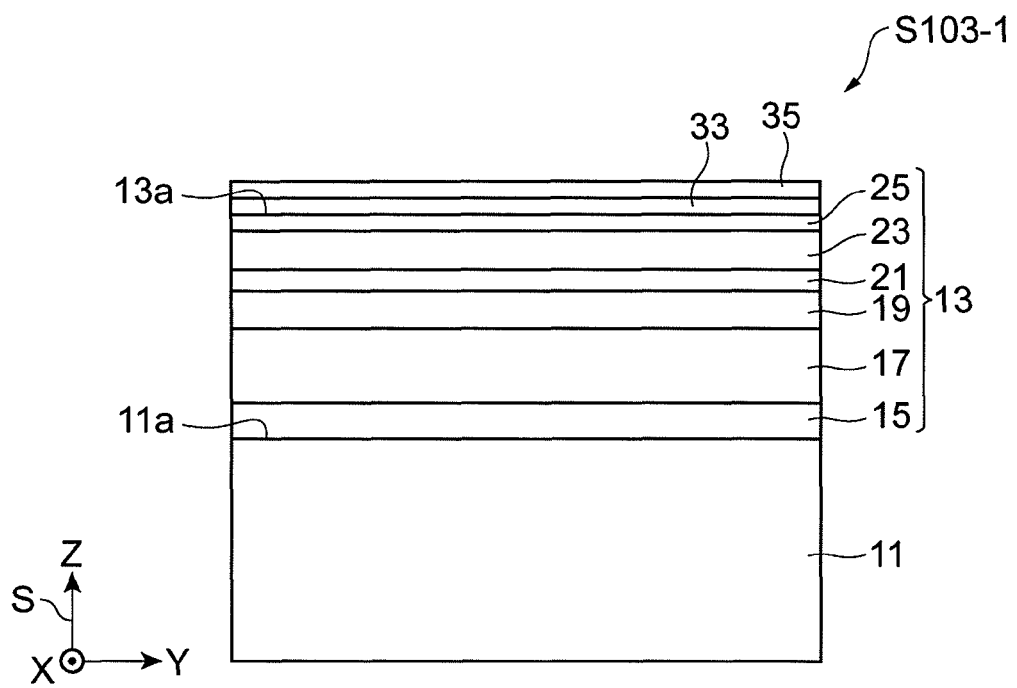
FIGS. 3A and 3B illustrate a step of forming diffraction gratings by patterning in a method for producing a semiconductor optical device according to the embodiment.

The mask 31 is formed by an electron beam exposure method or a nano-imprint method. As illustrated in FIG. 3A, in step S103-1, an insulator film 33 is formed on the principal surface 13a of the semiconductor region 13. The insulator film 33 is, for example, composed of SiN, $SiO_2$, SiON, or the like. When the insulator film 33 is, for example, a SiON film, this SiON film is formed by, for example, a CVD method. The SiON film has a thickness of, for example, 50 nm.

When an electron beam exposure method is employed, preparation for forming the mask 31 is performed in the following manner. A resist 35 for electron beam (EB) exposure is coated on the insulator film 33. The resist 35 has a thickness of, for example, 80 nm. The coordinates of the alignment mark W1 formed in the second region 13c of the semiconductor region 13 are read with an electron beam lithography system and a pattern for the mask 31 is subsequently drawn at a predetermined position with reference to the coordinates by using the electron beam lithography system. This pattern includes the first patterns 31a for defining diffraction gratings and the second pattern 31b used for evaluation and defining a monitoring structure.

Figure 3B:
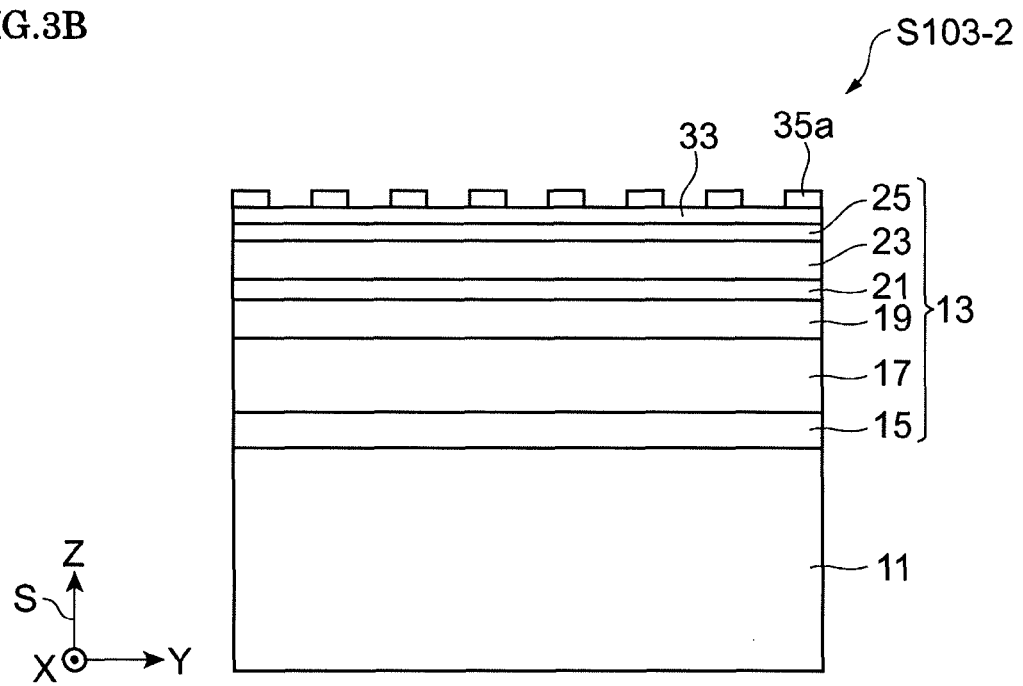

As illustrated in FIG. 3B, in step S103-2, a resist mask 35a is formed by developing the resist on which the first patterns 31a and the second pattern 31b for the mask 31 have been drawn. Thus, the first patterns 31a and the second pattern 31b are formed in the resist mask 35a.

Figure 4:
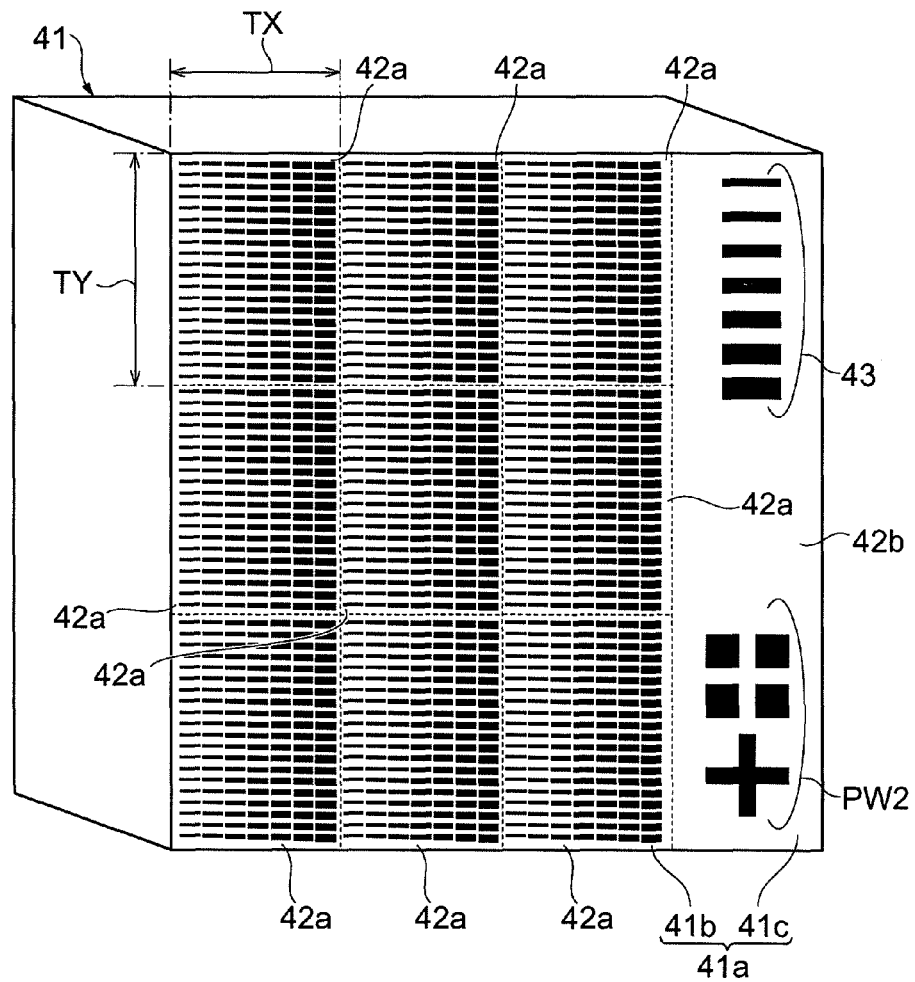
FIG. 4 illustrates a mold used in a nano-imprint method.

Alternatively, when a nano-imprint method is employed, preparation for forming the mask 31 is performed by the following steps. In a preparation step, a mold 41 illustrated in FIG. 4 is prepared. The mold 41 has a pattern surface 41a including first patterns 42a and a second pattern 42b. The first patterns 42a are disposed in a first area 41b of the pattern surface 41a. The second pattern 42b is disposed in a second area 41c of the pattern surface 41a. The first patterns 42a are arranged in arrays on the pattern surface 41a. The first patterns 42a are periodically arranged in the direction of an X axis with a period of a length TX corresponding to the length of one side of a semiconductor optical device. The first patterns 42a are also periodically arranged in the direction of a Y axis, which is orthogonal to the direction of the X axis, with a period of a length TY corresponding to the length of another side of the semiconductor optical device. In this case, in the mold 41, the size of a region corresponding to a single chip of a semiconductor optical device is TX×TY. The first patterns 42a define a plurality of periodic structures for forming diffraction gratings. The second pattern 42b in the second area 41c defines a second alignment mark PW2 and a monitoring structure 43.

In a subsequent coating step, a resin is coated on the principal surface 13a of the semiconductor region 13 to thereby form a resin layer for nano-imprinting. Such a resin may be composed of an ultraviolet (UV) curable resin, a thermoplastic resin, or the like. In a subsequent patterning step, as in the electron beam exposure method, the coordinates of the alignment mark W1 formed in the second region 13c of the semiconductor region 13 are read and the mold 41 is subsequently aligned with reference to the coordinates. The mold 41 is then pressed into the resin layer to thereby transfer the patterns formed in the mold 41 to the predetermined positions of the resin layer. When the resin layer is composed of a thermoplastic resin, the resin layer is softened by being heated to the glass transition temperature or higher and subsequently pressed with the mold 41. While the patterns of the mold 41 and the resin layer are kept in contact with each other, the mold 41 and the resin layer are cooled to a temperature at which the resin become cured to thereby cure the resin layer. As a result, the patterns are transferred to the resin layer. Alternatively, when the resin layer is composed of an ultraviolet (UV) curable resin, the resin layer is pressed with the mold 41. While the patterns of the mold 41 and the resin are kept in contact with each other, the resin is irradiated with ultraviolet rays to thereby cure the resin layer. As a result, the patterns are transferred to the resin layer. In this case, the mold 41 is composed of a transparent material to ultraviolet light, for example, quartz. If necessary, a repeating step in which moving of the mold 41 at a certain pitch and pressing of the mold 41 into a coated resin layer are alternately performed can be conducted. As a result of the above-described steps, a resin mask is formed on the principal surface 13a of the semiconductor region 13. The resin mask (corresponding to the resist mask 35a) includes the first patterns 42a (corresponding to the first patterns 31a) and the second pattern 42b (corresponding to the second pattern 31b). By conducting the patterning by a nano-imprint method, throughput can be considerably improved.

Thus, the preparation for forming the mask 31 for forming diffraction gratings and the monitoring structure has completed by an electron beam exposure method or a nano-imprint method.

Figure 5A:
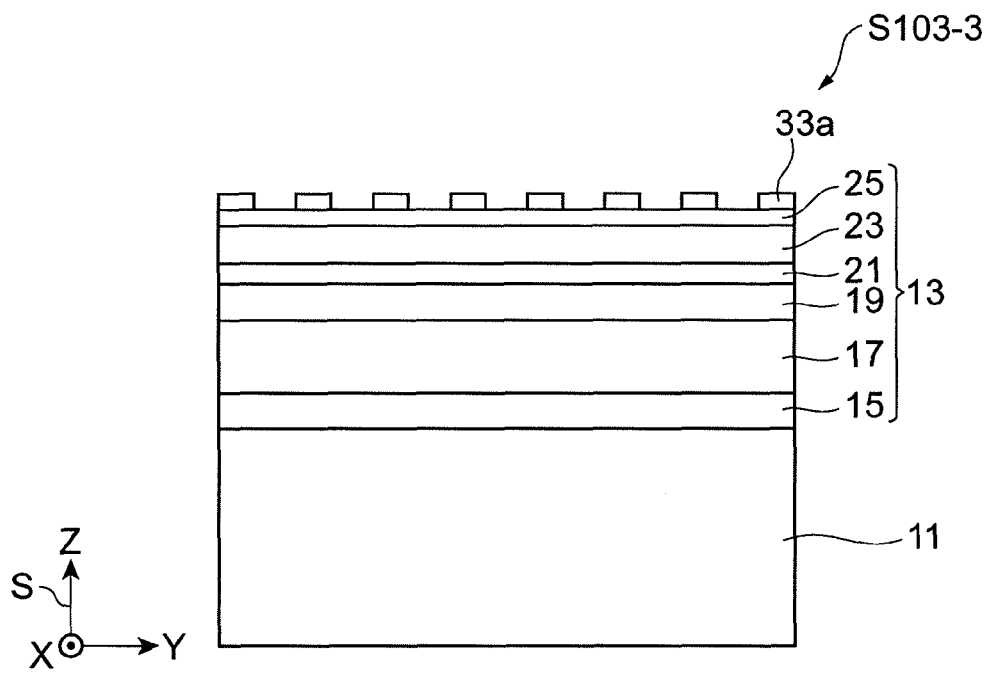
FIGS. 5A and 5B illustrate etching steps for forming diffraction gratings in a method for producing a semiconductor optical device according to the embodiment.

Hereinafter, steps in which an electron beam exposure method has been employed will be described. As illustrated in FIG. 5A, in step S 103-3, the insulator film 33 is etched through the resist mask 35a to thereby form an insulator film mask 33a (corresponding to the mask 31 in FIG. 2B). Such etching is conducted by, for example, reactive ion etching. When the insulator film 33 is a SiON film, $CF_4$ gas is used as an etching gas. After the insulator film mask 33a is formed, the resist mask 35a is removed by an $O_2$ plasma ashing method. When a nano-imprint method is employed, the insulator film 33 is etched through a resin mask instead of the resist mask 35a to thereby form the insulator film mask 33a.

Figure 5B:
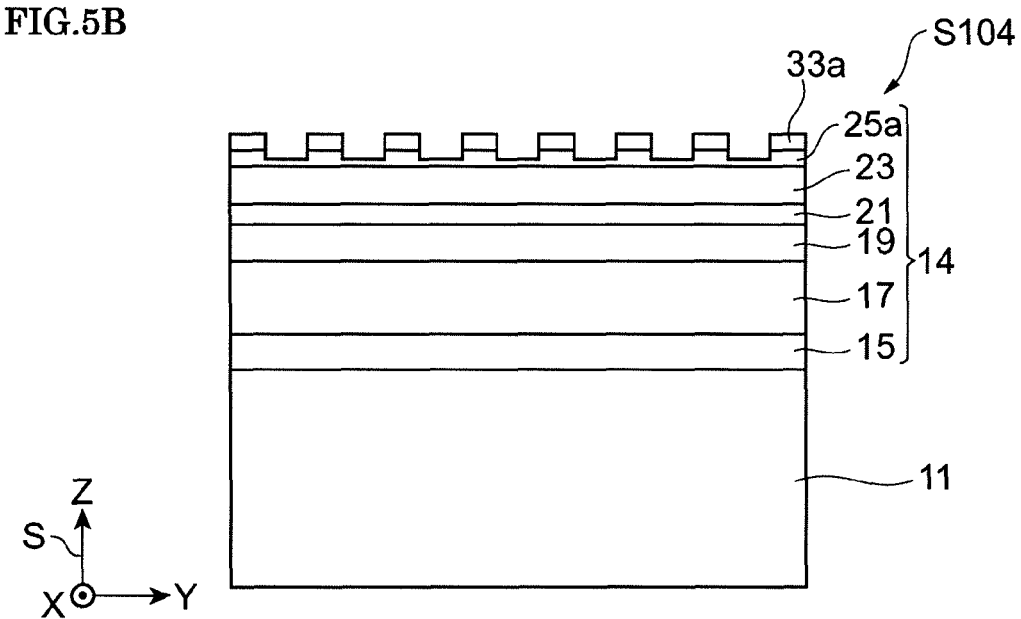

As illustrated in FIG. 5B, in step S104, the III-V group compound semiconductor layer 25 is etched through the insulator film mask 33a for a certain period to thereby form a diffraction grating layer 25a. Such etching is conducted by, for example, reactive ion etching. When the insulator film mask 33a is a SiON film, a $CH_4/H_2$ gas mixture can be used as an etching gas. After the diffraction grating layer 25a is formed, the insulator film mask 33a is removed. A SiON mask is removed with hydrofluoric acid.

FIG. 6 illustrates the top surface of a substrate product obtained in the step of forming the diffraction grating layer 25a. This substrate product P1 includes the semiconductor region 13. The diffraction grating layer 25a is provided as the uppermost layer of the semiconductor region 13. Referring to FIG. 6, a device section and an accessory section are illustrated. In the device section, the enlarged view of an area BOX defined by the broken lines illustrates an area in which nine semiconductor optical devices are to be formed: the arrangement of three sections in the X axis direction and three sections in the Y axis direction. The accessory section includes a monitoring structure 44 and an alignment mark W2. In the device section, periodic structures 42a, 42b, 42c, 42d, 42e, 42f, and 42g for forming a plurality of diffraction gratings are formed in each area corresponding to a single device. In the accessory section, the monitoring structure 44 for monitoring the shapes of the periodic structures 42a to 42g is provided. The periodic structures 42a to 42g are respectively formed by transferring the patterns of the pattern portions 32a to 32g. The periodic structures 42a to 42g each extend in an identical direction (direction of the Y axis). The periodic structures 42a to 42g share an identical periodicity but have different duty ratios from one another.

An example of the configuration of diffraction gratings will be described. Diffraction gratings of a plurality of types having different duty ratios from one another are formed within a region having a width corresponding to the width of a final laser chip. In a semiconductor laser having a lasing wavelength of the 1.5 μm band, the period of a diffraction grating is about 240 nm. This period can be calibrated by measuring the angle of diffraction with argon-ion laser light having a wavelength of 363.8 nm after a uniform and large-area pattern (5 mm×5 mm) is formed with an electron beam lithography system. When projections and recesses of a diffraction grating have a duty ratio of 1:1, κL is maximized. When the duty ratio deviates from 1:1, the product (κ×L) of the coupling coefficient (κ) and the cavity length (L) of a semiconductor laser decreases. Here, in the formation of diffraction gratings having a period of 240 nm, the pattern of diffraction gratings having nine types of duty ratios in which the width (the distance between adjacent resist patterns in a resist pattern column for a single diffraction grating) of recesses among projections and recesses on the surface of the diffraction grating layer is changed from 110 nm to 150 nm in steps of 5 nm is drawn. In a semiconductor laser having a lasing wavelength of the 1.3 μm band, the period of a diffraction grating is about 200 nm. The pattern of diffraction gratings having nine types of duty ratios in which the width is changed from 90 nm to 130 nm in steps of 5 nm is drawn (the duty ratio becomes 1:1 when the width is 100 nm).

Referring to FIG. 6, the periodic structures 42a to 42g are periodically (for example, over a distance corresponding to three periods) drawn in the direction of the X axis with a period corresponding to a length LX of a single device in the X axis direction. The periodic structures 42a to 42g are also periodically (for example, over a distance corresponding to three periods) drawn in the direction of the Y axis with a period corresponding to a length LY of a single device in the Y axis direction. Whichever periodic structure among the periodic structures 42a to 42g is selected as a starting structure, all the periodic structures 42a to 42g are always included within the length LX of a device from the starting structure in the X axis direction.

As illustrated in FIG. 6, the monitoring structure 44 includes, for example, a plurality of grooves 44a, 44b, 44c, 44d, 44e, 44f, and 44g. These grooves 44a to 44g respectively have widths B1 to B7, which are different from one another. For example, the grooves 44a to 44g are arranged adjacent to one another in the Y axis direction and each extend in the X axis direction.

Figure 7A:
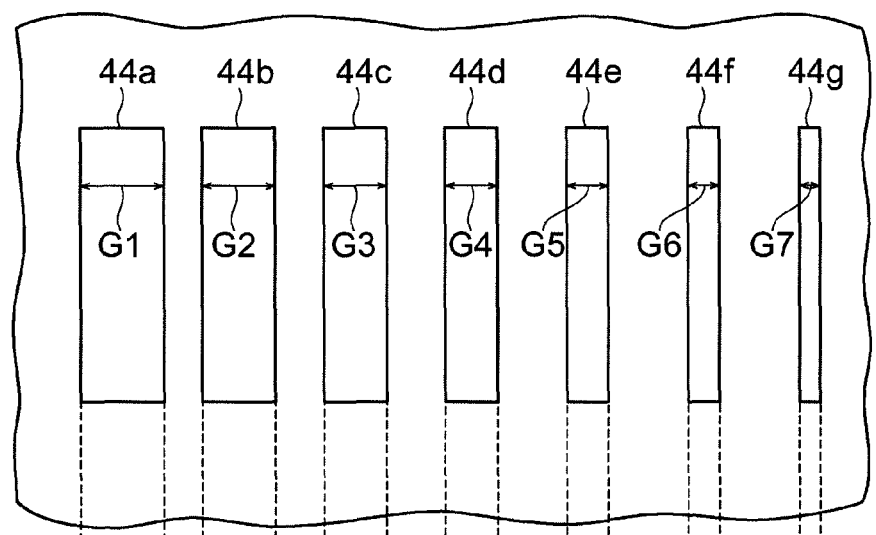
FIGS. 7A and 7B illustrate the relationship between the patterns of a monitoring structure and the depth of grooves formed by etching.
Figure 7B:
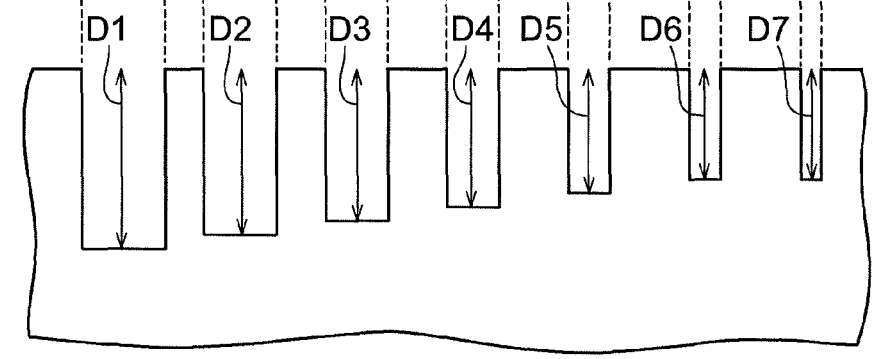

FIG. 7A is a plan view illustrating the monitoring structure 44 and an area around the monitoring structure 44. FIG. 7B is a sectional view of the monitoring structure 44. When the grooves 44a to 44g are formed by dry etching, the microloading effect of dry etching causes groove depths D1 to D7 to vary in accordance with groove widths G1 to G7. In the arrangement of the grooves 44a to 44g, the period is constant but the width of the grooves decreases monotonically. Accordingly, in the arrangement of the grooves 44a to 44g, a ratio of the distance between adjacent grooves to the width of the grooves also varies monotonically. Such a variation in the ratio probably exerts an influence upon the etching, the influence being similar to that the variation in the duty ratios exerts. To facilitate the alignment of a probe of an atomic force microscope for measuring the depths of the grooves with the position of the monitoring structure, the size of the grooves in the X axis direction is made 5 mm.

When the depths of recesses of diffraction gratings are actually measured after etching, these diffraction gratings having a plurality of duty ratios are measured and hence the workload for this measurement is too much. However, such troublesome measurement can be avoided in the following manner. The monitoring structure 44 is formed in an area different from an area in which devices are to be formed, the monitoring structure 44 including quasi-diffraction grating structures whose structures are different from those of the actual diffraction gratings. The shape of the monitoring structure 44 for measurement, specifically, the depth of grooves or the like is measured. The monitoring structure 44 is formed by etching with mask patterns having different duty ratios. Specifically, the pattern density of the mask pattern for forming the monitoring structure 44 is different from the pattern density of the mask pattern for forming the actual diffraction gratings. Accordingly, the micro-loading effect of reactive ion etching causes variation in the depth in accordance with the variation in the pattern density. Thus, to use the measurement results of the shape of the monitoring structure 44, as for patterns having the same duty ratio, the depth of a recess (groove) in an actual diffraction grating for a device is associated with the depth of a groove in the monitoring structure 44 in consideration of the difference in the depth of etched grooves caused by the difference in the pattern density.

In a monitoring step, the depths of the grooves 44a to 44g of the monitoring structure 44 are determined with a monitoring system 47. The monitoring system 47 may be, for example, an atomic force microscope, a scanning probe microscope, or the like.

The depths of the grooves of the monitoring structure 44 are measured before the mask 31 is removed. In this case, since the mask 31 is left, the etching amount can be adjusted by performing additional etching. Alternatively, the depths of the grooves of the monitoring structure 44 may also be measured after the mask 31 is removed. In this case, the measurement results of the shape of the monitoring structure 44 can be obtained by directly measuring the stepped portions of the grooves.

The measured values of the depths of the grooves of the monitoring structure 44 are used for selecting a periodic structure providing a desired κ×L from a group of the periodic structures 42a to 42g.

Figure 8A:
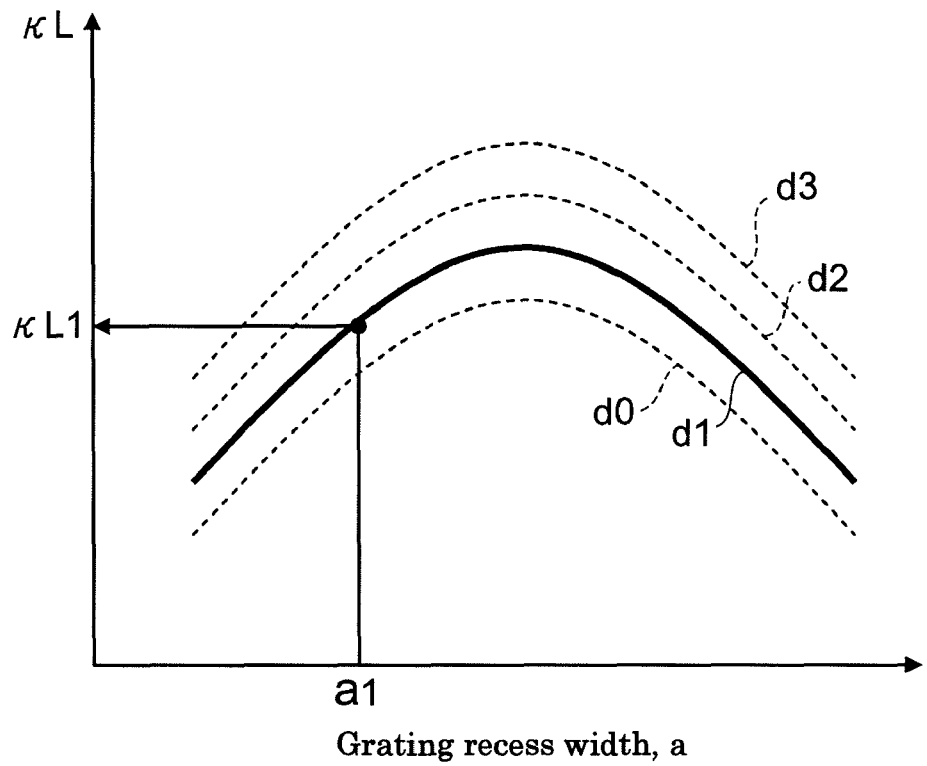
FIG. 8A is a graph illustrating the relationship between the width a of a recess (or a groove) of a diffraction grating and the product $\kappa \times L$ for the measured depths d0 to d3 of recesses (or grooves) of diffraction gratings.
Figure 8B:
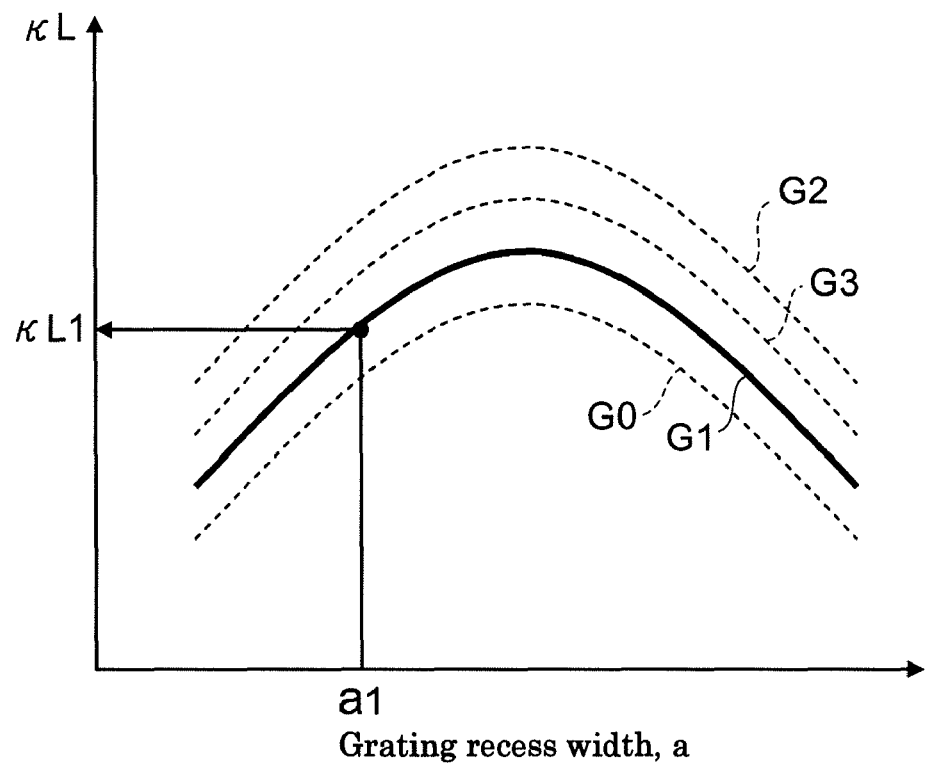
FIG. 8B is a graph illustrating the relationship between the width a of a recess (or a groove) of a diffraction grating and the product $\kappa \times L$ for the measured depths G0 to G3 of grooves of a monitoring structure.

FIG. 8A is a graph illustrating the relationship between the width (a) of a recess (space portion) of a diffraction grating pattern (line and space pattern) actually formed by etching and the product κ×L for the depths d0 to d3 of recesses or grooves of diffraction gratings actually formed. The width a of a recess of a diffraction grating is measured with a scanning electron microscope (SEM) in the step of forming the diffraction grating by patterning. The graph is prepared by measuring the widths of recesses of diffraction gratings and the depths of projections and recesses of actual diffraction gratings. At this time, the shape of inspection patterns that can be readily measured, that is, the depths of the monitoring structure 44, are measured and the relationship between the width a of a recess of a diffraction grating actually formed and the product κ×L for the depths G0 to G3 of the grooves of the monitoring structure 44 is prepared. The depths G0 to G3 of the grooves of the monitoring structure 44 is measured instead of measuring the depths d0 to d3 of projections and recesses of the diffraction gratings actually formed. FIG. 8B is a graph illustrating the relationship between the width (a) of a recess of a diffraction grating actually formed and the product κ×L for the depths G0 to G3 of grooves of the monitoring structure 44. By using the graph illustrated in FIG. 8B and measuring the depths of the grooves of the monitoring structure 44, the depths of projections and recesses of the diffraction gratings actually formed and the product κ×L can be estimated. Alternatively, instead of the width a of a recess of a diffraction grating actually formed, the value of the duty ratio of a diffraction grating actually formed may also be used.

Figure 9A:
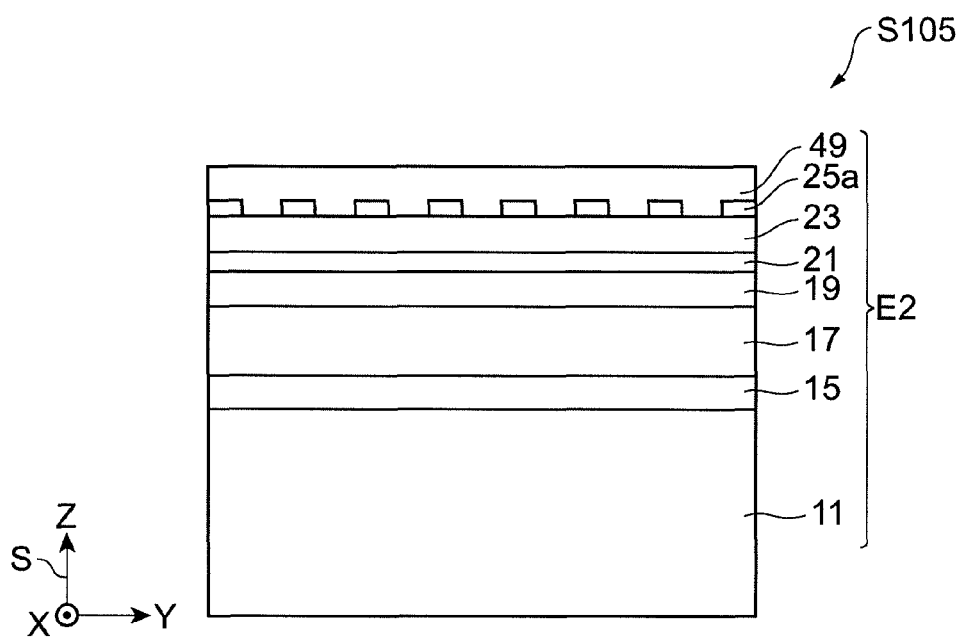
FIGS. 9A and 9B respectively illustrate a step of forming a first cladding layer and a step of forming stripe mesas in a method for producing a semiconductor optical device according to the embodiment.

Steps for producing a semiconductor laser will be continuously described. As illustrated in FIG. 9A, in step S105, a semiconductor region 49 is grown on the diffraction grating layer 25a. The semiconductor region 49 includes, for example, a p-type InP cladding layer and a p-type InGaAs cap layer. In step S105, the diffraction grating layer 25a is covered with the semiconductor region 49 to thereby produce an epitaxial substrate E2.

Figure 9B:
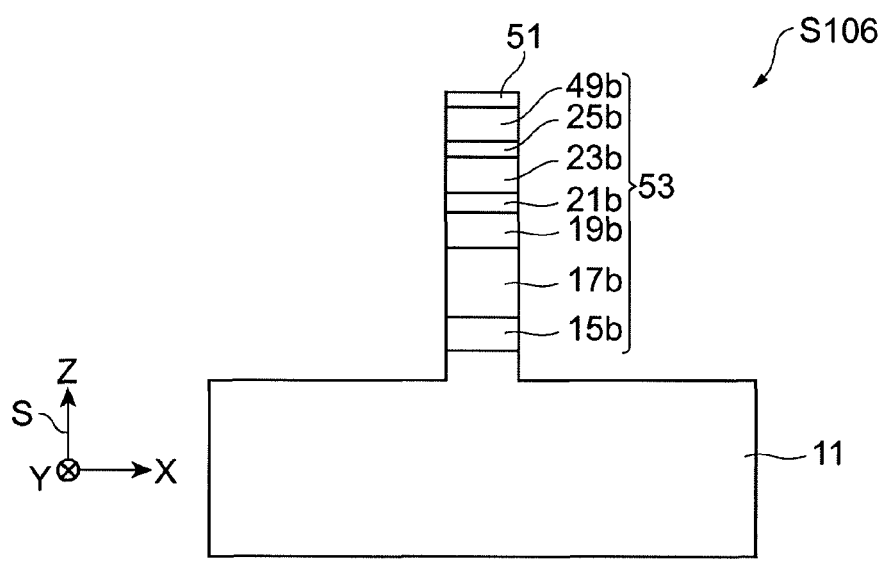

As illustrated in FIG. 9B, in step S 106, stripe mesas are formed. Specifically, in the epitaxial substrate E2, a periodic structure that can provide a desired κ×L value can be selected among the periodic structures 42a to 42g for forming diffraction gratings on the basis of the measurement results of the monitoring structure 44. In this example, as illustrated in FIG. 10, the periodic structure 42c is selected among the periodic structures 42a to 42g and stripe mesas including the periodic structures 42c are formed in a later process. The stripe mesas are aligned so as to include periodic structures that can provide a desired κ×L value. Whichever periodic structure is selected among the periodic structures 42a to 42g, the stripe mesas are periodically arranged. Thus, the device size of laser devices is not changed.

Referring to FIG. 9B, an example of the formation of stripe mesas will be described. A mask 51 that defines the orientation and the width of stripe mesas is formed. The mask 51 is formed by, for example, photolithography and etching. The mask 51 has a single stripe pattern in a single device section. The mask 51 is aligned so as to be a stripe pattern on the desired periodic structure in a single device section with reference to the alignment mark (W1 or W2) having been formed in an earlier step. In the above-described example, a method for forming the second alignment mark W2 in the first mask by a nano-imprint method is described. Alternatively, a similar pattern can also be formed by an electron beam exposure method. The mask 51 can be aligned with reference to the first alignment mark W1 formed in the epitaxial substrate E1 or the second alignment mark W2 formed in the substrate product. When exposure in an electron beam exposure method or the alignment of a mold in a nano-imprint method is performed with reference to the first alignment mark W1 and the mask 51 is aligned also with reference to the first alignment mark W1, the same alignment mark (W1) is used. Then, stripe mesas including desired diffraction gratings can be accurately formed. Additionally, the relative configuration of the first patterns 31a and the second pattern 31b can be always maintained during the step of forming these patterns for the first mask. By the way, the first alignment mark W1 formed in the epitaxial substrate E1 can be partially or entirely covered as a result of epitaxial growth performed later. In this case, it is difficult to align the mask 51 with reference to the first alignment mark W1. Then, the mask 51 is preferably aligned with reference to the second alignment mark W2. When the first mask is formed with a mold in which patterns including the second alignment mark has been formed by a nano-imprint method and the mask 51 is aligned with reference to the resultant second alignment mark, the relative configuration of the first and second patterns can be ensured with the accuracy of the patterns formed in the mold for forming the first mask. The mask 51 is constituted by an insulator film composed of, for example, SiN or $SiO_2$. The mask 51 has a thickness of, for example, 0.5 μm. When the insulator film is a SiN film, $CF_4$ gas is used as an etching gas for etching a SiN film. The pattern of a resist layer is transferred to the SiN film by reactive ion etching. After the etching is complete, the resist layer is removed by an $O_2$ plasma ashing method. Thus, the mask 51 is formed. The epitaxial substrate E2 is etched through the mask 51 to thereby form stripe mesas 53 including the periodic structure 42c. The mask 51 has a pattern of openings to be formed on periodic structures other than the desired periodic structure. The periodic structures 42a, 42b, 42d, 42e, 42f, and 42g other than the desired periodic structure 42c are removed in etching the epitaxial substrate E2 by using the mask 51. Therefore, a single stripe mesa structure is formed including only the desired periodic structure in a single device section and interference between the periodic structures can be avoided. The stripe mesas 53 include the semiconductor layers 15b, 17b, 19b, 21b, 23b, 25b, and 49b. Such etching may be performed by dry etching or wet etching. When wet etching is employed, the semiconductor layers are etched by using bromine methanol ($Br:CH_3OH$) as an etchant. The stripe mesas formed by etching include an active layer having a width of 1.2 μm. The stripe mesas have a height of, for example, about 2.0 μm.

Figure 11A:
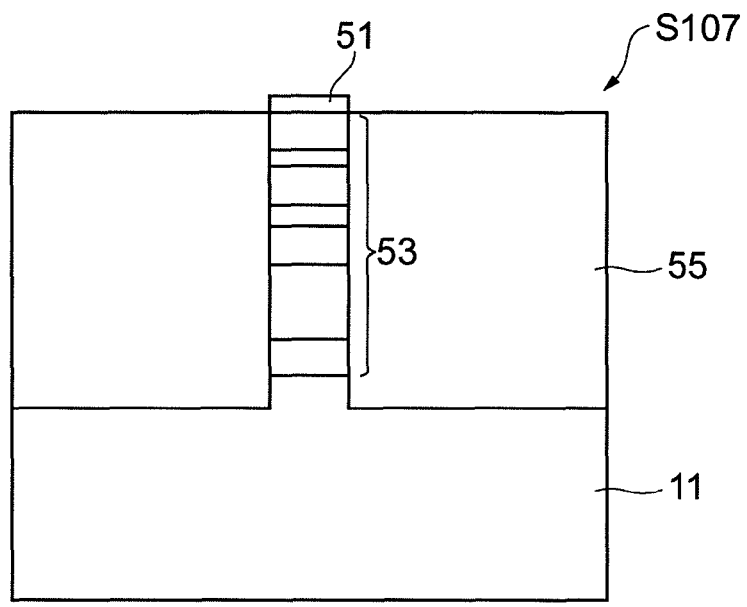
FIGS. 11A and 11B respectively illustrate a step of forming a buried layer and a regrowth step in a method for producing a semiconductor optical device according to the embodiment.

As illustrated in FIG. 11A, in step S107, a buried layer 55 is grown on the side of the stripe mesas 53 by using the mask 51 as a selective growth mask. For example, the buried layer 55 can have a buried structure having pn-current blocking layers or having a high resistive current blocking layer made of, for example, Fe-doped InP. When such a buried structure having pn-current blocking layers is employed, a p-type InP layer having a thickness of 1 µm is grown, an n-type InP layer having a thickness of 1 µm is subsequently grown, and a p-type InP layer having a thickness of 0.2 µm is further grown. After growing the buried layer 55, the mask 51 is removed. When the mask 51 is made of SiN, the mask 51 is removed by using, for example, hydrofluoric acid as an etchant. After the mask 51 is removed, the cap layers which are the uppermost layers of the stripe mesas 53 may be removed and semiconductor mesas can be formed. When the cap layers are composed of InGaAs, the cap layers can be removed by selective etching with a mixed solution of phosphoric acid and aqueous hydrogen peroxide.

Figure 11B:
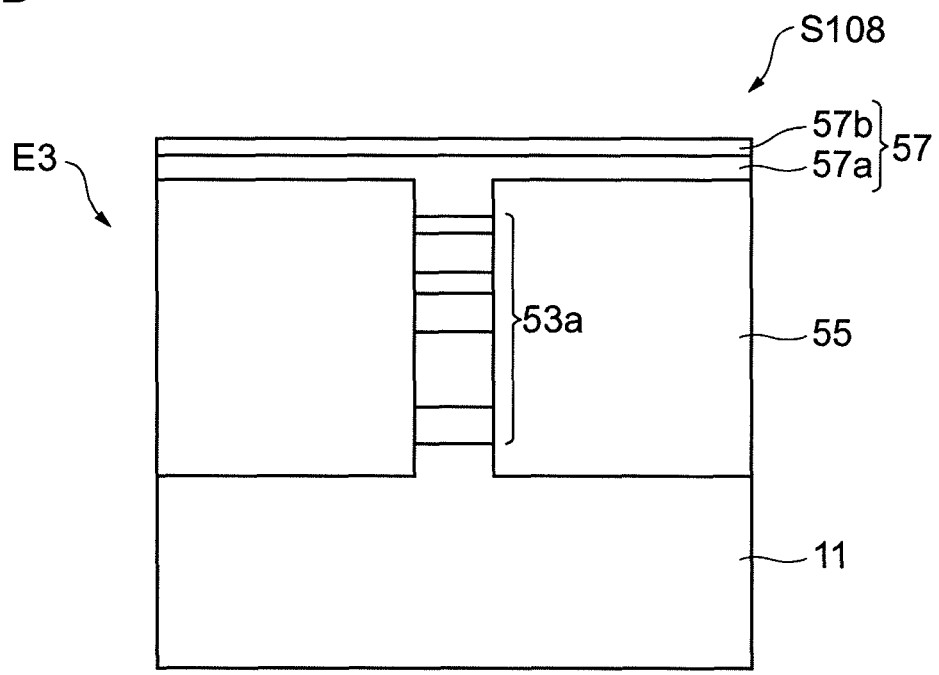

As illustrated in FIG. 11B, in step S108, a semiconductor region 57 is grown on the stripe mesas 53 and the buried layer 55, then an epitaxial substrate E3 is produced. The semiconductor region 57 includes, for example, a p-type InP cladding layer 57a and a p-type InGaAs contact layer 57b.

In the step of forming electrodes, electrodes are formed on the epitaxial substrate E3. An insulator film having openings for forming the electrodes is formed. An ohmic metal of Ti/Pt/Au is deposited over the openings for forming the electrodes and the insulator film. By performing a liftoff process, electrodes having a predetermined pattern are formed. The back surface of the semiconductor substrate 11 is polished so that the thickness of the substrate 11 is decreased to about 100 µm. AuGe ohmic metal is deposited onto the polished surface. Thus, the substrate product is provided.

This substrate product is divided into laser bars. Each laser bar is divided into a large number of semiconductor laser chips. Since a plurality of periodic structures for diffraction gratings are periodically arranged, laser bars can be cut such that each stripe mesa is at a desired position within a region corresponding to a single chip.

As a result of these steps, semiconductor lasers can be produced.

As has been described, a plurality of diffraction gratings are formed by etching in each region that will become a single semiconductor laser chip. These diffraction gratings have different duty ratios from one another. Each diffraction grating has an arrangement of projections and recesses or grooves defined by a period and a duty ratio. In addition to the diffraction gratings, measurement patterns having the same duty ratios as the diffraction gratings are formed. By performing etching to form the diffraction gratings, grooves corresponding to the measurement patterns are also formed. The depths of the grooves of the measurement patterns and the depths of recesses or grooves of the actual diffraction gratings are measured and the relationship among the depth of the grooves, the duty ratio, and a diffraction grating pattern having a desired coupling coefficient is determined in advance. To achieve a desired coupling coefficient in the actual production of semiconductor lasers, a periodic structure having an appropriate coupling coefficient can be selected among periodic structures having various duty ratios on the basis of measured values of the depths of the grooves of the measurement patterns and the duty ratios of the measurement patterns. Stripe mesas are formed at positions of diffraction gratings selected upon the formation of the stripe mesas. Therefore, variation in characteristics of semiconductor lasers caused by variation in coupling coefficients caused by variation in the etching depth of diffraction gratings can be suppressed and the yield of semiconductor lasers can be enhanced.

Principles of the present invention have been described on the basis of preferred embodiments with reference to the drawings. However, those skilled in the art will understand that the present invention can be changed in terms of arrangements and detailed portions without departing from the principles. The present invention is not restricted to the specific configurations disclosed in the embodiments. Therefore, all the modifications and changes within the scope and the spirit of Claims are claimed as the present invention.

What is claimed is:

1. A method for producing a semiconductor optical device, comprising the steps of:
    forming a semiconductor region including a semiconductor layer on a substrate, the substrate including first and second areas; the first area including device sections;
    forming a first mask on the semiconductor region, the first mask including first patterns periodically arranged in the first area and a second pattern provided in the second area;
    forming a plurality of periodic structures in each of the device sections in the semiconductor region in the first area and a monitoring structure in the semiconductor region in the second area by using the first mask, the periodic structures respectively corresponding to the first patterns, the monitoring structure corresponding to the second pattern;
    measuring a shape of the monitoring structure;
    selecting a desired periodic structure from the plurality of periodic structures on a basis of a result of measuring the shape of the monitoring structure;
    forming a second mask including a pattern on the desired periodic structure; and
    forming stripe mesas including the desired periodic structure by using the second mask.

2. The method according to claim 1, wherein the plurality of periodic structures include projections and recesses periodically arranged so as to form diffraction gratings.

3. The method according to claim 1,
    wherein the plurality of periodic structures each extend in a predetermined direction; and
    the plurality of periodic structures have an identical period but have different duty ratios from one another.

4. The method according to claim 1,
    wherein the second mask includes openings formed on periodic structures other than the desired periodic structure; and
    the periodic structures other than the desired periodic structure are removed upon formation of the stripe mesas.

5. The method according to claim 1, further comprising a step of growing a buried layer for burying the stripe mesas.

6. The method according to claim 1, wherein the monitoring structure includes a plurality of grooves having different widths from one another.

7. The method according to claim 6,
    wherein the plurality of periodic structures each extend in a predetermined direction;
    the plurality of grooves are arranged adjacent to one another in the predetermined direction;
    distances between adjacent grooves among the plurality of grooves arranged are different from one another; and
    the plurality of grooves each extend in a direction intersecting with the predetermined direction.

8. The method according to claim 1, wherein the step of measuring the shape of the monitoring structure is performed with an atomic force microscope.

9. The method according to claim 1, further comprising a step of forming a first alignment mark in the semiconductor region in the second area,
- wherein, in the step of forming the first mask, the first mask is formed by an electron beam exposure method or a nano-imprint method;
- exposure in the electron beam exposure method or alignment of a mold in the nano-imprint method is performed with reference to the first alignment mark; and
- the pattern of the second mask is aligned with reference to the first alignment mark.

10. The method according to claim 1,
- wherein the first mask is formed by a nano-imprint method;
- the first mask includes a pattern for forming a second alignment mark; and
- the pattern of the second mask is aligned with reference to the second alignment mark.

11. The method according to claim 1, further comprising a step of removing the first mask after the step of forming a plurality of periodic structures and forming a monitoring structure by using the first mask, wherein the step of measuring the shape of the monitoring structure is performed after the step of removing the first mask.

12. The method according to claim 1, further comprising a step of removing the first mask after the step of forming a plurality of periodic structures and forming a monitoring structure by using the first mask,
- wherein the step of measuring the shape of the monitoring structure is performed before the step of removing the first mask.

13. The method according to claim 1, wherein the semiconductor region includes a first optical waveguide layer, an active layer, a second optical waveguide layer, and a diffraction grating layer.

14. The method according to claim 13,
- wherein the stripe mesas include the first optical waveguide layer, the active layer, the second optical waveguide layer, and the diffraction grating layer; and
- the periodic structures include projections and recesses periodically arranged so as to form diffraction gratings and the periodic structures are formed in the diffraction grating layer.

* * * * *